June 14, 1966 R. H. WALKER 3,256,497

ELECTRO-MECHANICAL TONE OSCILLATOR HAVING FAST RISE TIME

Original Filed Sept. 14, 1962

INVENTOR.
ROBERT H. WALKER
BY Mueller & Aichele
ATTYS.

3,256,497

ELECTRO-MECHANICAL TONE OSCILLATOR HAVING FAST RISE TIME

Robert H. Walker, Morton Grove, Ill., assignor to Motorola, Inc., Franklin Park, Ill., a corporation of Illinois Continuation of application Ser. No. 223,769, Sept. 14, 1962. This application May 3, 1965, Ser. No. 457,242

6 Claims. (Cl. 331—116)

Figure 1:
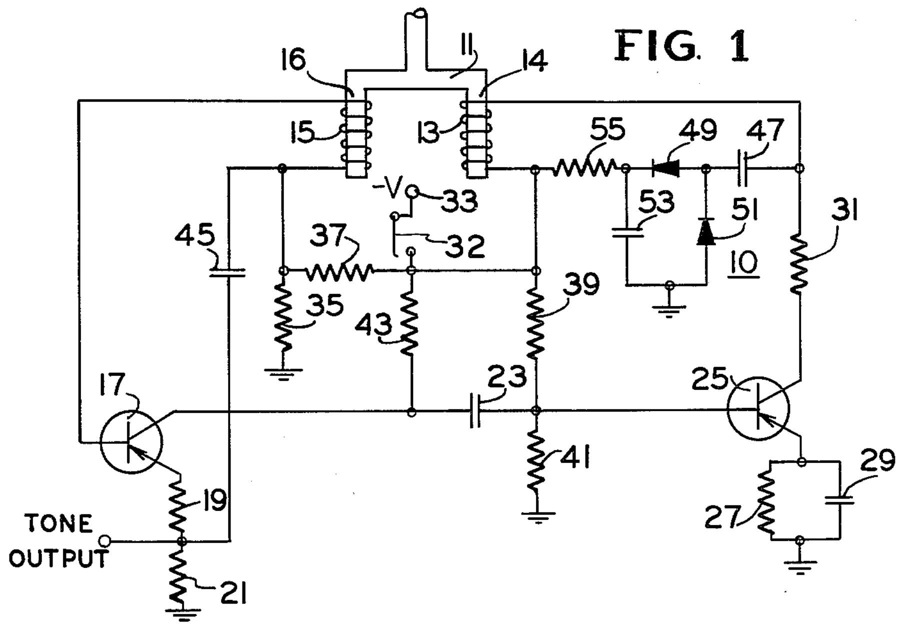

This application is a continuation of application Serial No. 223,769, filed September 14, 1962, now abandoned.

This invention relates to oscillators controlled by a resonant mechanical member, and more particularly to such an oscillator which incorporates an improved circuit wherein the oscillations reach a usable amplitude very quickly.

Low frequency oscillators including a reed or tuning fork to control the frequency are suited to a number of applications, including tone sources for selective signalling or calling systems in radio communications. In such an oscillator, the resonant reed or fork may control the frequency by controlling the oscillator feedback. Generally one or more coils drive and sense the vibrations of the reed or fork and provide feedback for causing oscillations to be built up at a predetermined frequency and then sustained. Oscillations from the oscillator may then be used to drive a modulator in a transmitter. Receivers having circuits incorporated therein responsive only to the transmitted tone signal are rendered operable to receive a transmitted message which follows or which is superimposed on the tone signal. There are many known ways in which transmitted tone signals may be used to selectively activate selected ones of a plurality of receivers.

At the transmitters of the selective calling systems a number of oscillators may be provided for generating the various tone signals required. Because of the time required for the oscillators to build up oscillations to a given level, in many cases the oscillators are kept constantly operating and the outputs thereof are connected when required. Obviously, from a power consumption standpoint, such a system is undesirable since a large number of oscillators may be operating continuously and the output thereof is used only a small part of the time.

Accordingly, it is an object of this invention to provide an oscillator incorporating a mechanical resonant member and an improved circuit wherein oscillations build up to a useable amplitude very rapidly.

Still another object of the invention is to provide an oscillator incorporating a mechanically resonant member and an improved circuit which will rapidly bring the amplitude of oscillations to a usable level and which will maintain this amplitude at a desired level.

A feature of the invention is the provision of an oscillator utilizing a mechanically resonant member and a circuit wherein oscillations are built up rapidly by feedback, with attenuation action taking place only after oscillations have built up to an operating level to hold the oscillations at a predetermined level.

Another feature of the invention is the provision, in an oscillator utilizing a mechanically resonant member, of an amplifier circuit and an attenuating circuit including a diode circuit and a capacitor providing a given time constant and wherein said attenuating circuit allows the member to achieve usable amplitude before introducing attenuation of the driving voltage.

Still another feature of the invention is the provision of an oscillator starting circuit which applies a momentary initial surge of direct current to shock the mechanically resonant member into vibration and which avoids the necessity of extra switch contacts or relays.

Figure 2:
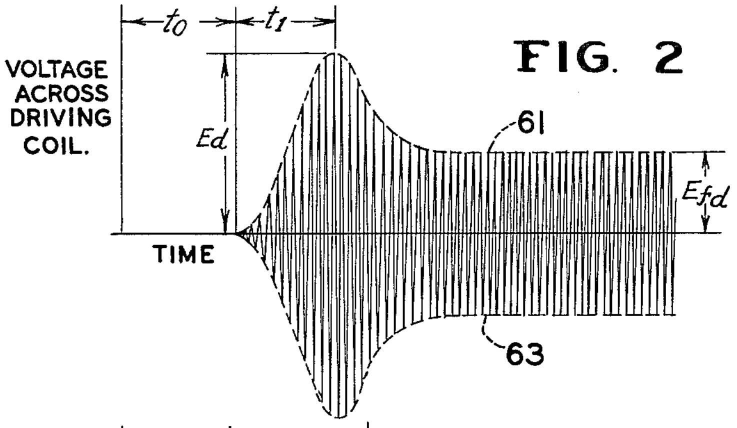
Figure 3:
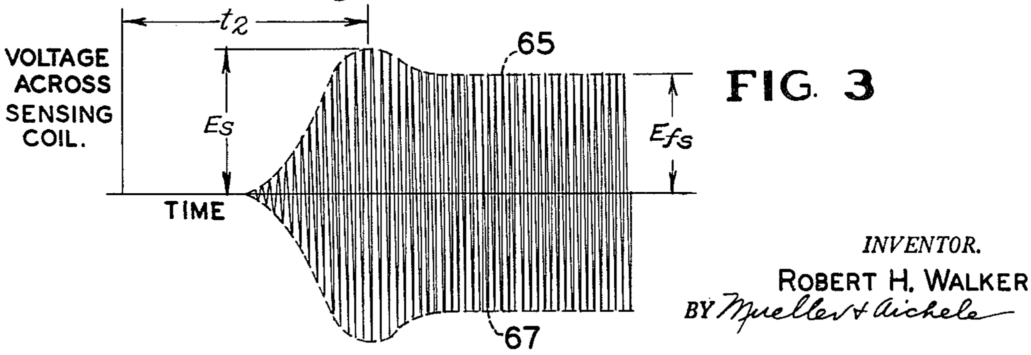

In the drawing:

FIG. 1 is a schematic diagram of an oscillator constructed in accordance with the invention; and FIGS. 2 and 3 illustrate the variation of voltage across the drive coil and the sensing coil with time.

In a particular form of the invention there is provided an oscillator including a mechanical vibratory structure having a given resonant frequency and further having a drive coil and a sensing coil. The sensing coil is connected to the input of an amplifier, and the output of this amplifier is connected to the drive coil. Connection is also made from the output of the amplifier through a diode circuit to ground for providing attenuation of the signal across the drive coil. The diode circuit has a time constant such that it has no attenuating effect for a time period during which the output of the amplifier reaches a usable value, and then the diode circuit provides attenuation of the driving voltage to reduce the gain of the oscillator. Initial excitation of the driving coil is provided by a capacitor circuit which presents a momentary low impedance path for direct current excitation of the vibratory structure to shock it into vibration. The resultant A.C. output in the sensing coil is amplified by the amplifier and applied to the driving coil to provide oscillatory feedback. Then, as the voltage builds up, current will flow through the diode circuit to ground to control the gain of the oscillator. This attenuation action, however, is delayed sufficiently to allow the vibratory structure to achieve a usable amplitude of vibration. Thus, the oscillator will rapidly build up to a usable output but, after reaching that output, will remain at a steady level until turned off.

Referring now to FIG. 1, there is depicted a mechanically resonant member 11 in the form of a tuning fork which may be mounted in a suitable manner for vibrating at its resonant frequency. Although the resonant member shown is in the nature of a tuning fork, it will be apparent to those skilled in the art that the invention has application to many varieties of mechanically resonant structures. The driving coil 13 has low impedance, and is positioned about one arm 14 of the tuning fork 11. A sensing coil 15 which has high impedance, is positioned about the arm 16 of the tuning fork 11. Current is fed to coil 13 to set the fork 11 in motion. This motion causes current to be developed in coil 15 and fed back to coil 13 to produce sustained vibrations of the member 11. The coils 13 and 15 may be positioned in various ways in relation to the resonant member 11 to drive and sense the same. For example, the coils may surround the extremities of the vibratory member, as shown in the schematic diagram, or they may be coupled adjacent to the member or to a portion thereof.

In the circuit of FIG. 1, coil 15 is coupled between the base and emitter electrodes of transistor 17 by capacitor 45. Resistors 19 and 21 make up the emitter bias network for transistor 17. The collector electrode of transistor 17 is coupled through capacitor 23 to the base electrode of transistor 25. Emitter bias for transistor 25 is provided by resistor 27 and capacitor 29 coupled in parallel to ground. The collector electrode of transistor 25 is connected through resistor 31 to coil 13 to provide oscillator feedback thereto.

Base bias for transistors 17 and 25 is provided through switch 32 from a negative potential of direct current at terminal 33. Switch 32 may be closed by the "push-to-transmit" button of the transmitter. The base bias network for transistor 17 includes resistors 35 and 37, and the base bias network for transistor 25 includes resistors 39 and 41. The negative potential 33 is further coupled through switch 32 and resistor 43 to the collector electrode of transistor 17. Coil 13 is directly connected through switch 32 to the source of negative potential 33.

The oscillator output may be derived across resistor 21, and may be applied to any desired circuit, such as the modulator of a transmitter.

A portion of the output of transistor 25 is coupled through capacitor 47 to an automatic gain control or attenuating circuit including diodes 49 and 51 and capacitor 53. When switch 32 is closed, the negative potential at terminal 33 is applied to capacitor 53 through a resistor 55.

The time constants in the bias circuits of both transistors 17 and 25 are selected to be short enough so that the full gain of both transistors is obtained before any movement of the fork 11 takes place. Thus, when the oscillator is turned on by switch 32, a current surge flows from source 33 through coil 13, and from there through capacitor 47 and diode 51 to ground. This low impedance path provides a momentary D.C. surge of substantial magnitude without the need for complex switches or relays to cut out the D.C. after the initial excitation surge. The sharp pulse produced by this surge shocks the fork 11 into a momentary state of oscillation.

As the output of coil 15 rises due to oscillation of fork 11, it is amplified by transistors 17 and 25 and applied back to coil 13 in phase and with a very high amplitude. This is due to the high gain of transistors 17 and 25, and also due to the fact that the full output of transistor 25 is impressed across coil 13 because of the high initial A.C. impedance presented by diodes 49 and 51.

As the amplitude of vibration of fork 11 continues to build up, the direct current flow from source 33 through resistor 55 charges capacitor 53, and when this capacitor is charged to a predetermined voltage, current begins to flow through diodes 49 and 51 to ground. This reduces the A.C. impedance presented by diodes 51 and 49, to the output of transistor 25 causing the signal impressed across coil 13 to be attenuated. This action takes place because the oscillations at the output of transistor 25 are applied to the circuit 10 including resistor 31, capacitor 47, and the two parallel branches, one including diode 49 and capacitor 53, and the other including diode 51. The time constant of resistor 55 and capacitor 53 is chosen to delay the negative direct current flow through the diode network to allow sufficient time for fork 11 to come up to full amplitude. Once capacitor 53 has charged sufficiently for increased direct current flow through diodes 49 and 51, the forward bias of the diodes is increased, lowering the A.C. impedance presented to the output of transistor 25. Thus, the signal derived across the capacitor 47 and the parallel branches and applied to the coil 13 is attenuated, thereby limiting the gain of the oscillator to a predetermined value to control the amplitude of vibration of fork 11.

Referring now to FIG. 2, the variation in voltage across drive coil 13 is there illustrated. This voltage builds up from a zero value to a maximum amplitude $E_d$ in a very short peroid of time $t_1$. Then, as the effect of the delayed attenuation system is applied, the amplitude of the A.C. voltage declines to a final steady state value $E_{fd}$. The envelope of amplitude is depicted by dotted lines 61 and 63. The time interval $t_o$ represents the reaction time of fork 11 after current is applied to the coil 13.

A similar plot for coil 15 is also shown in FIG. 3. Here it may be seen that the amplitude of the A.C. voltage across the coil 15 rapidly builds up to a value $E_s$ in interval $t_2$, and then slightly declines to a steady state value $E_{fs}$. The envelope of this amplitude is depicted by lines 65 and 67. The ratio of $E_s$ to $E_{fs}$ is a function of the mounting resonance of the tuning fork 11.

With components of the following values, and a reaction time of the fork of about forty to fifty milliseconds, the oscillator output reached maximum amplitude in about eighty to one hundred milliseconds.

| | | |
|---|---|---|
| Resistor **19** | ohms | 18 |
| Resistor **21** | kilohms | 2.7 |
| Capacitor **23** | microfarads | 30 |
| Resistor **27** | kilohms | 3.3 |
| Capacitor **29** | microfarads | 30 |
| Resistor **31** | kilohms | 2.2 |
| Source **33** | volts | —14 |
| Resistor **35** | kilohms | 5.6 |
| Resisitor **37** | do | 5.6 |
| Resistor **39** | do | 6.8 |
| Resistor **41** | do | 5.6 |
| Resistor **43** | do | 2.2 |
| Capacitor **45** | microfarads | 30 |
| Capacitor **47** | do | 22 |
| Capacitor **53** | do | 47 |
| Resistor **55** | kilohms | 15 |

From the foregoing discussion it will be apparent that the invention provides an oscillator incorporating a mechanically resonant structure and an improved circuit which permits the structure to reach a usable amplitude of vibration rapidly, while incorporating attenuation for steady output.

I claim:

1. A tone oscillator including in combination, amplifier means having input and output circuits, a mechanically resonant vibratory structure responsive at a given frequency and having a predetermined reaction time, inductance means coupled to said vibratory structure and including a driving coil connected to said output circuit, said inductance means having a portion connected to said input circuit to apply thereto signals derived from the vibratory structure to thereby form an oscillating circuit, said amplifier means including a control circuit for controlling the gain of said oscillating circuit between an initial relatively high level and a relatively low operating level, and switch means connected to said control circuit and operable to cause operation of said oscillating circuit at the initial level, said control circuit including means connected to said switch means and forming a direct current path in which current flows upon operation of said switch means to cause said control circuit to reduce the gain of said oscillating circuit to the operative level, said control circuit further including delay means to delay the reduction in the gain of said oscillating circuit to the operating level until after a time delay which is greater than the reaction time of said vibratory structure, whereby said oscillating circuit operates at the initial relatively high level to cause fast build up of oscillations when said switch means is operated and operates after said time delay at the relatively low operating level to cause continued oscillations.

2. A tone oscillator including in combination, amplifier means having input and output circuits, a mechanically resonant vibratory structure responsive at a given frequency and having a predetermined reaction time, inductance means coupled to said vibratory structure and including a driving coil connected to said output circuit, said inductance means having a portion connected to said input circuit to apply thereto signals derived from the vibratory structure to form an oscillating circuit at the frequency of said vibratory structure, said amplifier means including a control circuit including energy storage capacitor means for controlling the level of signals applied by said output circuit to said driving coil according to the direct current potential across said capacitor means, switch means connected to said amplifier means and operable to initiate operation of the oscillating circuit so that said amplifier provides signals in said output circuit having an initial level, said switch means being connected to said control circuit and operable when initiating operation of the oscillating circuit to provide a direct current path for said capacitor means to change the direct current potential thereacross to reduce the level of said signals applied by said output circuit to said driving coil to an operating level, said control circuit further including resistance means connected in the direct current path to provide a delay in the change of potential across said capacitor means which is greater than the reaction time of said vibratory structure, whereby said output circuit applies signals to said driving coil having a level greater than said operating level for a time period greater than the reaction time of said vibratory structure to facilitate the build up of oscillations in said oscillating circuit.

3. A tone oscillator including in combination, amplifier means having input and output circuits, a mechanically resonant vibratory structure responsive at a given frequency and having a predetermined reaction time of the order of forty milliseconds, inductance means coupled to said vibratory structure and including a driving coil connected to said output circuit, said inductance means having a portion connected to said input circuit to apply thereto signals derived from the vibratory structure to form an oscillating circuit at the frequency of said vibratory structure, said amplifier means including a control circuit connected to said output circuit thereof, said control circuit including energy storage capacitor means for controlling the gain of said oscillating circuit according to the direct current potential across said capacitor means, switch means connected to said amplifier means and operable to initiate operation of the oscillating circuit at an initial gain level, said switch means being connected to said control circuit and operable when initiating operation of the oscillating circuit to provide a direct current path for said capacitor means to change the direct current potential thereacross to reduce the gain of said oscillating circuit to an operating level, said control circuit further including resistance means connected in the direct current path to provide a delay in the change of potential across said capacitor means of the order of eighty milliseconds, whereby said oscillating circuit has a gain greater than said operating level for a time period greater than the reaction time of said vibratory structure to facilitate the build up of oscillations in said oscillating circuit.

4. A tone oscillator including in combination, amplifier means having input and output circuits, a mechanically resonant vibratory structure responsive at a given frequency and having a predetermined reaction time, inductance means coupled to said vibratory structure including a driving coil connected to said output circuit, said inductance means having a portion connected to said input circuit to apply thereto signals derived from said vibratory structure to form an oscillating circuit at the frequency of said vibratory structure, said amplifier means including a control circuit connected to said output circuit thereof, said control circuit including energy storage capacitor means for controlling the gain of said oscillating circuit according to the direct current potential across said capacitor means and a charging circuit connected to said capacitor means, switch means connected to said amplifier means and operable to initiate operation of the oscillator circuit at an initial gain level, said switch means being connected to said charging circuit and operable when initiating operation of the oscillator circuit to provide a direct current path for said capacitor means to change the direct current potential thereacross to cause operation of said oscillating circuit at a reduced level, said charging circuit further including resistance means connected in the direct current path to provide a delay in the change of potential across said capacitor means which is greater than the reaction time of said vibratory structure, whereby said oscillating circuit operates initially at a level greater than the operating level to provide rapid build up of oscillations.

5. A tone oscillator including in combination, a mechanical structure having vibratory resonance at a given frequency, a driving coil and a sensing coil for respectively driving and sensing the vibration of said structure, an amplifier circuit coupling said sensing coil to said driving coil to feed back amplified signals at said given frequency of said structure for sustaining oscillations at said given frequency, a first capacitor and a first diode and a second capacitor connected in stated order from the output of said amplifier circuit to ground, said first diode being poled to be normally conducting toward ground, a second diode connected in parallel with said first diode and said second capacitor and poled to be normally conducting away from ground, switch means providing a direct current potential which is negative with respect to ground, a resistor connecting said switch means to the juncture between said second capacitor and said first diode, the time constant of said resistor and said second capacitor being such that negative direct current flow through said first and second diodes to ground will be delayed to present a temporarily high impedance to the output of said amplifier circuit, whereby attenuation of the signal across said driving coil during initial actuation of said oscillator is delayed until sufficient time has elapsed to permit said oscillations to attain a predetermined amplitude.

6. A tone oscillator including in combination, a mechanical structure having vibratory resonance at a given frequency, a driving coil having first and second ends and a sensing coil for respectively driving and sensing the vibration of said structure, an amplifier circuit coupling said sensing coil to said first end of said driving coil to feed back amplified signals at said given frequency of said structure for sustaining oscillations at said given frequency, a first capacitor and a first diode and a second capacitor connected in stated order from the output of said amplifier circuit to ground, said first diode being poled to be normally conducting toward ground, a second diode connected in parallel with said first diode and said second capacitor and poled to be normally conducting away from ground, switch means connecting a direct current potential which is negative with respect to ground to said second end of said driving coil, said first capacitor and said second diode completing an initial current path from said first end of said driving coil through said driving coil to ground for providing an initial actuating pulse to said driving coil to shock said structure into vibration, a resistor connecting said switch means to the juncture between said second capacitor and said first diode, the time constant of said resistor and second capacitor being such that negative direct current flow through said first and second diodes to ground will be delayed to present a temporarily high impedance to the output of said amplifier circuit, whereby upon initial application of said source of negative direct current potential said structure will be shocked into vibration which vibration will be sensed by said sensing coil and amplified by said amplifier circuit, the full output of which will appear across said driving coil until attenuation of the signal across said driving coil occurs due to increasing direct current flow through said first and second diodes.

References Cited by the Examiner

UNITED STATES PATENTS 2,049,177 7/1936 Rumpel ------------ 331—156

OTHER REFERENCES

Sheridan et al., "Tuning Fork Oscillator," RCA Technical Notes, No. 133.

NATHAN KAUFMAN, *Acting Primary Examiner.*

ROY LAKE, S. H. GRIMM, *Assistant Examiners.*